United States Patent [19]

Mikata et al.

[11] Patent Number: 5,237,196
[45] Date of Patent: Aug. 17, 1993

[54] SEMICONDUCTOR DEVICE AND METHOD FOR MANUFACTURING THE SAME

[75] Inventors: Yuuichi Mikata, Kawasaki; Katsunori Ishihara, Yokohama, both of Japan

[73] Assignee: Kabushiki Kaisha Toshiba, Kawasaki, Japan

[21] Appl. No.: 524,666

[22] Filed: Apr. 30, 1990

Related U.S. Application Data

[63] Continuation of Ser. No. 180,844, Apr. 12, 1988, abandoned.

[30] Foreign Application Priority Data

Apr. 14, 1987 [JP] Japan .................. 62-89773

[51] Int. Cl.$^5$ .................. H01L 29/04; H01L 29/68
[52] U.S. Cl. .................. 257/409; 257/412; 257/655; 257/315
[58] Field of Search .................. 357/59 G, 23.5, 59, 357/90; 437/109, 191; 257/409, 412, 315, 655

[56] References Cited

U.S. PATENT DOCUMENTS

| | | | |
|---|---|---|---|
| 4,380,773 | 4/1983 | Goodman | 357/59 G |
| 4,584,760 | 4/1986 | Okazawa | 29/571 |
| 4,597,159 | 7/1986 | Usami et al. | 437/191 |
| 4,755,865 | 7/1988 | Wilson et al. | 357/59 G |

FOREIGN PATENT DOCUMENTS 61-190981A 8/1986 Japan .
8314192 12/1983 United Kingdom .

OTHER PUBLICATIONS

Devices Electronics for Integrated Circuits: 2nd Edition by Muller and Kamins, Copyright 1977, 1986, by John Wiley & Sons, Inc., Section 10.6 pp. 505-514.
Harbeke et al., "LPCVD Polycrystalline Silicon: Growth and Physical Properties of In-Situ Phosphorus Doped and Undoped Films", Jun. 1983, pp. 287-322.
Flowers, "Gate Oxide Degradation in the Polysilicon Doping/Activation Process," J. Electrochem. Soc., vol. 134, No. 3, pp. 698-702, Mar. 1987.

*Primary Examiner*—Mark V. Prenty
*Attorney, Agent, or Firm*—Finnegan, Henderson, Farabow, Garrett & Dunner

[57] ABSTRACT

A poly-Si film is formed on a first insulating film overlying a semiconductor substrate. A second insulating film is formed on the poly-Si film. The poly-Si film comprises a layered structure of a non-single crystal type silicon film and contains a phosphorus concentration of less than $5 \times 10^{20}$ cm$^{-3}$ or contains no phosphor, a poly-Si film having a phosphorus concentration of over $5 \times 10^{20}$ cm$^{-3}$ and a poly-Si film having a phosphorus concentration of less than $5 \times 10^{20}$ cm$^{-3}$ or containing no phosphorus. Since the phosphorus concentrations of the non-single crystal type silicon film adjacent to the first insulating film and poly-Si film adjacent to the second insulating film are reduced, the phosphorus in these two films are not diffused toward the corresponding insulating films. It is thus possible to improve the breakdown voltage across the first and second insulating films.

3 Claims, 6 Drawing Sheets

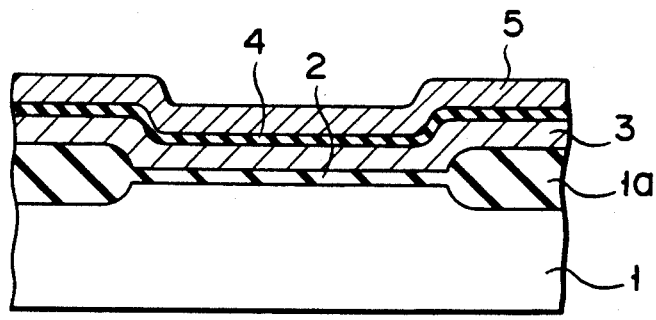
F I G. 1
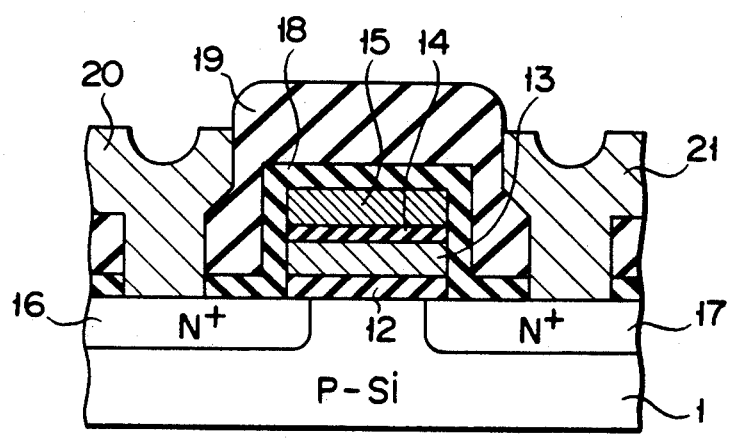
F I G. 2
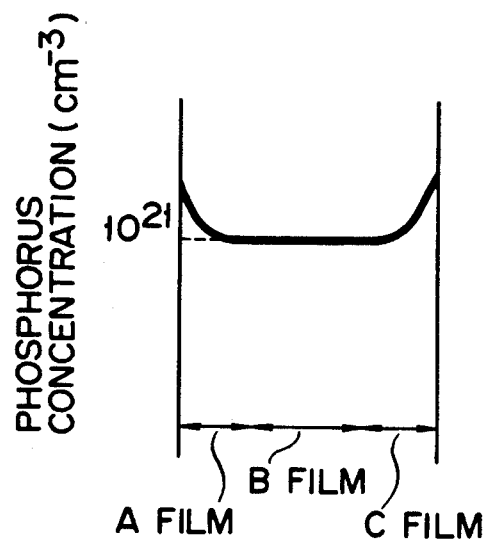
F I G. 3

SEMICONDUCTOR DEVICE AND METHOD FOR MANUFACTURING THE SAME

This application is a continuation of application Ser. No. 180,844, filed Apr. 12, 1988 and now abandoned.

BACKGROUND OF THE INVENTION

1. Field of the Invention

The present invention relates to a semiconductor device capable of improving a breakdown voltage on a thin insulating film formed between poly-Si layers, and to a method for manufacturing the same.

2. Description of the Related Art

Known in a semiconductor device of a type which is manufactured by forming a poly-Si film on an insulating film overlying a major surface of a semiconductor substrate, forming an insulating film on the poly-Si film and forming a poly-Si layer, these poly-Si films being employed as an electrode.

An EPROM is known as this type of a semiconductor device. FIG. 1 is a cross-sectional view showing one of manufacturing steps of a conventional EPROM. In FIG. 1, first thermal oxide film 2 of 500 Å in thickness and field oxide film are formed over the surface of P- type silicon substrate 1, the field oxide film surrounding an element area. First poly-Si layer 3 of 1000 Å in thickness, which is used as a floating gate electrode formation layer, is formed by means of a low-pressure chemical vapor deposition (CVD) method on field oxide film 1 and on first thermal oxide film 2.

Phosphorus are doped by means of a thermal diffusion method into first poly-Si silicon film 3. The surface of first poly-Si film 3 is thermally oxidized at about 1000° C., thereby forming second thermal oxide film 4 having a thickness of 500 Å.

Second poly-Si film 5 for control gate electrode formation is formed on the surface of a resultant structure by means of a low-pressure CVD method. Phosphorus are doped by means of a thermal diffusion method into second poly-Si film 5.

FIG. 2 is a cross-sectional view showing a model of a conventional EPROM. An explanation will be given below of the process for manufacturing a conventional EPROM, by referring to FIGS. 1 and 2 (a complete view).

Second poly-Si film 5, second thermal oxide film 4, first poly-Si film 3 and first thermal oxidation film 2 are sequentially etched by means of a photoetching method. As a result, control gate electrode 15, second gate oxide film 14, floating gate electrode 13 and first gate oxide film 12 are formed in the semiconductor structure as shown in FIG. 2.

Then an N-type impurity is ion-implanted into a surface portions of the semiconductor structure 1 using control gate electrode 15, second gate oxide film 14, floating gate electrode 13 and first gate oxide film 12 as masks. Substrate 1 is heat-treated, thereby diffusing the N-type impurity deep into substrate 1. As a result, N+ type drain region 16 and N+ type source region 17 are formed in the semiconductor substrate.

The surface of the resultant structure is thermally oxidized to provide thermal oxide film 18 with which the surfaces of substrate 1 and control gate electrode 15, as well as the side surfaces of second gate oxide film 14, floating gate electrode 14 and first oxide film, are surrounded.

Passivation layer 19, such as a PSG film, is deposited on the whole surface of the resultant surface.

Passivation layer 19 is selectively etched to form contact holes. As a result, the portions of drain region 16 and source region 17 are exposed at the locations of the contact holes. An A(-Si layer is deposited wholly on the surface of the resultant structure, followed by a patterning step to provide drain electrode 20 and source electrode 21. In this way, a conventional EPROM is completed as shown in FIG. 2.

The EPROM is of such a type that it allows the writing of data by the application of a high positive voltage across N+ type drain region 16 and control gate electrode 15 and the injection of electrons into floating gate electrode 13.

It is necessary that electrons injected into floating gate electrode 13 be stored in floating gate electrode 13 for a prolonged period of time.

There are cases where, if any high positive voltage is applied to control gate electrode 15 for some accidental reason or other, the electrons thus stored in floating gate electrode 13 are absorbed via second gate oxide film 14 and data is dissipated. This phenomenon that, when a high voltage is applied to control gate electrode 15, electrons stored in floating gate electrode 13 are absorbed via second gate oxide film 14 into control gate electrode 15 is believed to be caused by the following reason.

After deposition of poly-Si film 3 for the formation of floating gate electrode 13, phosphorus are doped by the thermal diffusion into first poly-Si silicon film 3 and the surface of first poly-Si film 3 is thermally oxidized to provide second thermal oxide film 4 as second gate oxide film 14.

After the deposition of second poly-Si film 5 for the formation of control gate electrode 15, phosphorus are doped by a thermal diffusion method into second poly-Si film 5.

Then various thermal treatments are performed at the steps including the formation of thermal oxide film 18.

Phosphorus are doped into first poly-Si film 3 and second poly-Si film 5 and migrated toward first thermal oxide film 2 and second thermal oxide film 4, respectively.

As a result, a phosphorus concentration profile in first poly-Si film 3 and second poly-Si film 5 is as shown in FIG. 3. That is, the phosphorus concentration becomes higher at the outer edge portions A and C of first poly-Si film 3 and second poly-Si film 5.

This means that the phosphorus are diffused into first thermal oxide film 2 and second thermal oxide film 4. As a result, the close density of first thermal oxide film 2 and second thermal oxide film 4 is reduced to reveal the electrical conductivity. The breakdown voltage is thus reduced, permitting the ready electron migration.

When a high voltage is applied to control gate electrode 15, electrons stored in floating gate electrode 13 is absorbed in control gate electrode 15 via second gate oxide film 14.

SUMMARY OF THE INVENTION

The object of the present invention is to provide a semiconductor device capable of improving a breakdown voltage on a thin insulating film provided between poly-Si layers and a method for manufacturing the same.

According to the present invention, a semiconductor device is provided which comprises a first insulating film formed on a major surface of a semiconductor substrate, a film of silicon other than a single crystal silicon formed on the first insulating film and having either a phosphorus concentration which is lower than the concentration in the first film or contains no phosphorus, a first poly-Si film formed on the film of silicon and having a higher phosphorus concentration than that of the film of silicon, a second poly-Si film formed on the first poly-Si film and having a lower phosphorus concentration than that of the first poly-Si film or containing no phosphorus, and a second poly-Si film formed on the second poly-Si insulating film.

In the semiconductor device of the present invention, since the non-single crystal silicon film adjacent to the first insulating film and second poly-Si film adjacent to the second insulating film have a lower phosphorus concentration, phosphorus in the non-single silicon film and second poly-Si film are not diffused into the first insulating film and the breakdown voltage of the first and second insulating films is improved.

In another aspect of the present invention there is provided a method for manufacturing a semiconductor device, which comprises the steps of forming a first insulating film on a major surface of a semiconductor substrate; forming, on the first insulating film, a non-single crystal film having a lower phosphorus concentration or never containing any phosphorus; forming a first poly-Si film on the non-single crystal film at a temperature higher than when the non-single crystal silicon film is formed, the first poly-Si film having a higher phosphorus concentration than that of the non-single crystal silicon film; forming on the first poly-Si film a second poly-Si film having a lower phosphorus concentration or never containing any phosphorus; and forming a second insulating film on the second poly-Si layer.

In the method of the present invention, first and second poly-Si films are formed over an underlaying non-single crystal silicon film having an assumed high concentration profile of silicon atoms as adsorption spots in which case the first and second poly-Si films have a particle size of, for example, below 100 Å so that the first and second poly-Si films become denser. Since the phosphorus impurity is doped upon forming the first and second poly-Si films, the manufacturing process can be shortened unlike the case where, in the conventional method, phosphorus are diffused into the poly-Si film after the poly-Si film has been formed. Even if the second insulating film is formed over the resultant structure, since the second poly-Si film contains small grains, the enhancement of an electric field at an interface resulting from the unevenness of the crystal is reduced to a greater extent. Furthermore, since the second poly-Si film of a lower phosphorus concentration is formed over the first poly-Si film, even if the second insulating film is formed on the second poly-Si film, the diffusion of the phosphorus into the second insulating film is decreased, thus improving the breakdown voltage of the second insulating film.

BRIEF DESCRIPTION OF THE DRAWINGS

FIG. 1 is a cross-sectional view showing one process for manufacturing a conventional semiconductor device;

FIG. 2 is a cross-sectional view showing the conventional semiconductor device as applied to an EPROM;

FIG. 3 shows a phosphorus concentration profile of a polycrystalline layer of a conventional semiconductor device structure;

DETAILED DESCRIPTION OF THE PREFERRED EMBODIMENTS

The embodiment of this invention will be explained below by referring to the accompanying drawings.

Figure 4A:
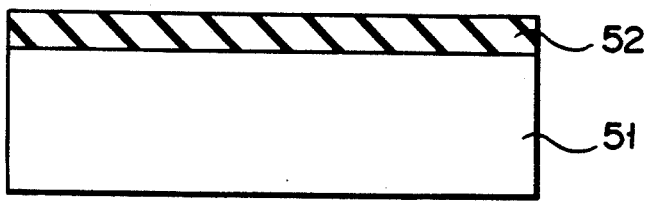
FIGS. 4A to 4G are views showing a manufacturing process of a semiconductor device of the present invention.
Figure 4B:
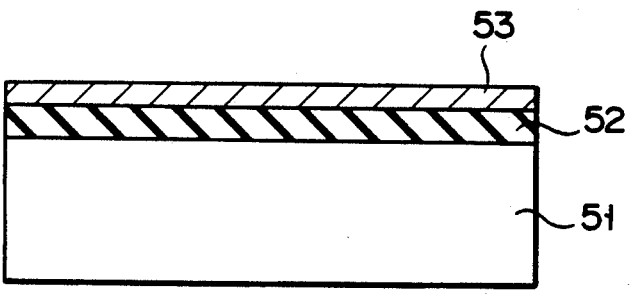

First thermal oxide film (insulating film) 52 of 500 Å in thickness is formed by a thermal oxidation method on the surface of substrate 51 at 700° C. to 1100° C. in either a dry $O_2$, $H_2O$, or $HCl+O_2$ atmosphere (FIG. 4A). Silicon film 53 of at least 30 Å being other than a single crystal type is deposited by a LPCVD method on the resultant structure at a reaction temperature of 400° C. to 600° C. in a thermally decomposed silane/phosphine gaseous atmosphere ($SiH_4/PH_3$) (FIG. 4B). Here, being a silicon film other than a single crystalline type means that the film is either an amorphous silicon or polycrystalline silicon (poly-Si), and will be called a non-single crystal type silicon film hereinafter.

When the deposition temperature of film 53 is below 600° C., the crystallization of Si atoms adsorbed on thermal oxide film 52 progresses only slightly in forming non-single crystal type silicon film 53.

The reason why the thickness of non-single crystalline type silicon film 53 is 30 Å is because the surface of first thermal oxide film 52 must be covered with non-single crystal type silicon film 53 of a uniform density, and due to the small deposition rate involved in the formation of film 53 by the LPCVD method, a lot of time is required if the thickness of the film is greater than necessary.

Figure 4C:
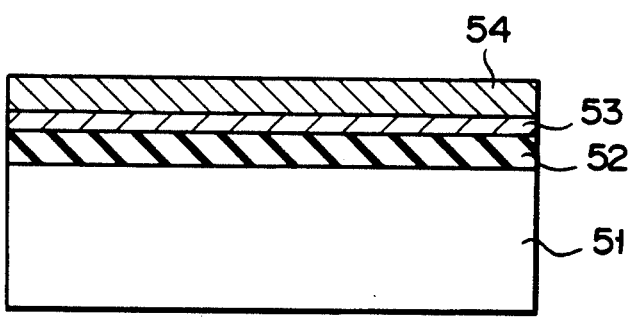

Subsequent to forming non-single crystal type silicon film 53, that is, increasing the reaction temperature to 600° to 800° in the LPCVD device without exposing substrate 51 to an external atmosphere, 1000 Å-thick poly-Si film 54 with a phosphorus concentration of $1 \times 10^{21}$ cm$^{-3}$ is formed on the resultant structure under a thermally decomposed silane/phosphine gaseous atmosphere ($SiH_4/PH_3$) (FIG. 4C).

Figure 4D:
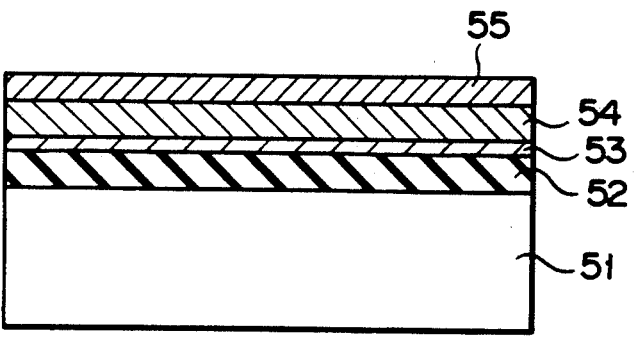
Figure 4E:
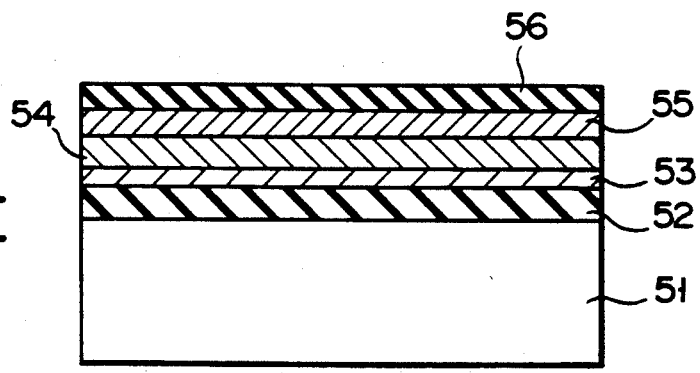

Then 500 Å-thick poly-Si film 55 with a phosphorus concentration of $1 \times 10^{20}$ cm$^{-3}$ is formed at a reaction temperature of 400° to 800° C. in a thermally decomposed silane/phosphine gaseous atmosphere ($SiH_4/PH_4$) with the use of the LPCVD device (FIG. 4D). The concentration of phosphorus in non-single crystal type silicon film 53 and poly-Si film 55 may be less than $5 \times 10^{20}$ cm$^{-3}$ and that of phosphorus in poly- Si film 54 may be over $5 \times 10^{20}$ cm$^{-3}$. It is possible that no phosphorus atoms are contained in non-single crystal type silicon film 53 and poly-Si layer 55. The surface of poly-Si film 55 is thermally oxidized at 700° to 1100° C. in either one of a dry $O_2$ or $H_2O$ atmosphere, or one of a diluted $HCl/O_2$, Ar, or a $N_2$ atmosphere to form 500 Å-thick second thermal oxide film 56 (insulating film) (FIG. 4E).

Figure 4F:
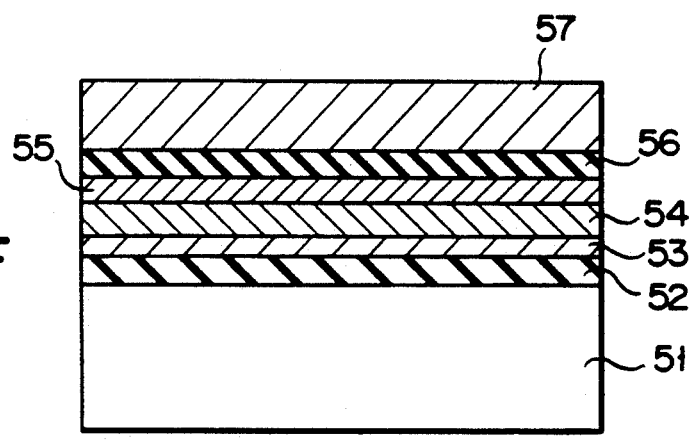

Second thermal oxide film 56 serves as a dielectric film of a capacitor if the semiconductor device of the present invention is used for the memory cells of an EPROM. Second poly-Si layer 57 of 3500 Å with a sheet resistivity of 20 Ω is deposited on second thermal oxide film 56 (FIG. 4F).

In the case where the semiconductor device of the present invention is used for memory cells of EPROMs, non-single crystal type silicon film 53, poly-Si film 54, and poly-Si film 55 constitute a floating gate electrode as one electrode of a capacitor, and poly-Si layer 57 constitutes a control gate electrode as the other electrode of that capacitor.

Figure 4G:
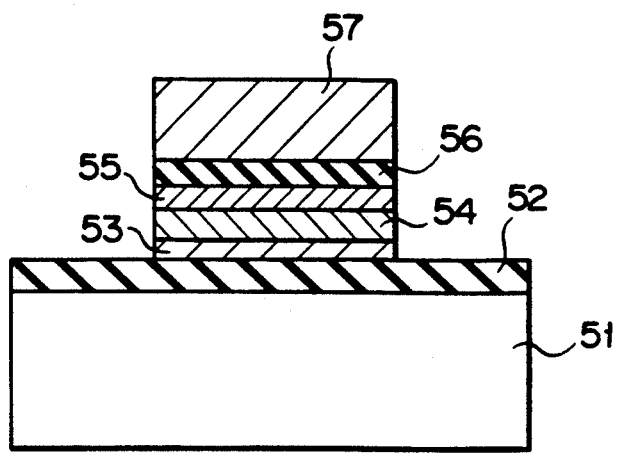

Poly-Si film 57, second thermal oxide film 56, poly-Si film 55, poly-Si film 54 and non-single crystal type silicon film 53 are sequentially etched to provide a capacitor of a memory cell as shown in FIG. 4G.

Figure 5:
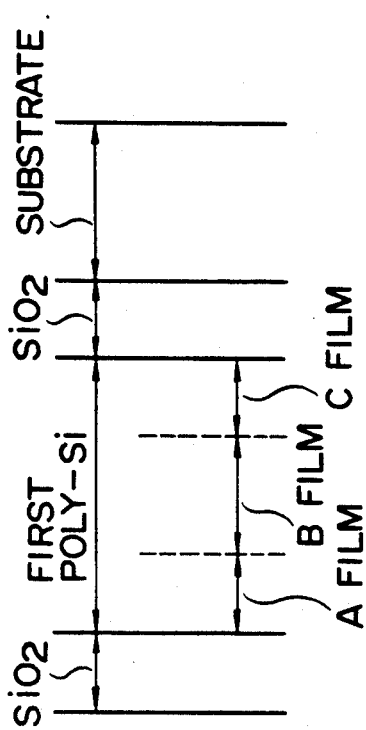
FIG. 5 shows cross-sectional views corresponding to FIGS. 4D and 4E which are the steps of manufacturing a semiconductor device of the present invention.
Figure 5:
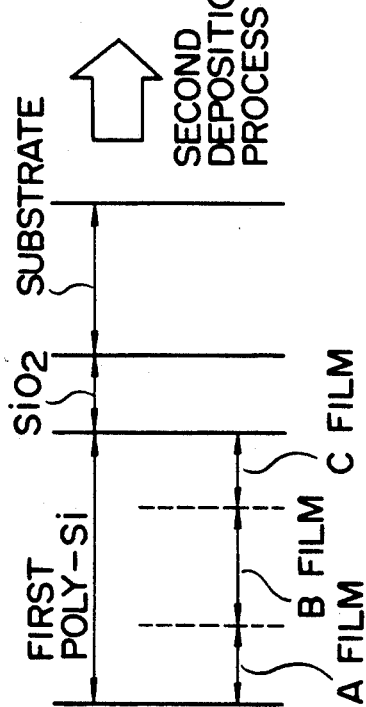

FIG. 5 is a cross-sectional view showing a capacitor, as a model, as shown in FIG. 4E. In FIG. 5, for ease of explanation, a first poly-Si layer is given which is composed of A, B, and C films which correspond to poly-Si film 55, poly-Si film 54 and non-single crystal type silicon layer 53, respectively. It is to be noted that the process involved in the formation of the C film and the formation of the A film is called a first deposition process, and that the process involved in the formation of second thermal oxide film 56 is called a second deposition process.

As shown in FIG. 5, in the first deposition process, silicon is deposited on first insulating film 52 (overlying semiconductor substrate 51) at a reaction temperature of 400° C. to 600° C. to form a non-single crystal silicon film (C film) in which case the crystallization of the silicon is only slightly developed. Then the reaction temperature is increased to 600° C. to 800° C., which is substantially the same temperature as that used in the conventional technique, to form a poly-Si film (A film + B film) and then a first poly-Si layer (A film + B film + C film), wherein the size of the particles are very small; under 100 Å. That is, even if the reaction temperature is at substantially the same level as that of the conventional technique, a poly-Si film having a particle size of under 100 Å can be formed at the same requisite time as in the conventional technique. In the second deposition process, a second insulating film is formed on the second poly-Si film and, in this case, an interface between the first poly-Si film and the second insulating film reveals a more even distribution of the film and a decrease in an impurity trap to allow a high breakdown voltage to be obtained.

The phosphorus of the first poly-Si film formed by the conventional thermal diffusion method has a higher concentration in the C area adjacent to the first insulating film and the A area adjacent to the second insulating film than in the B area as shown in FIG. 3.

Figure 6:
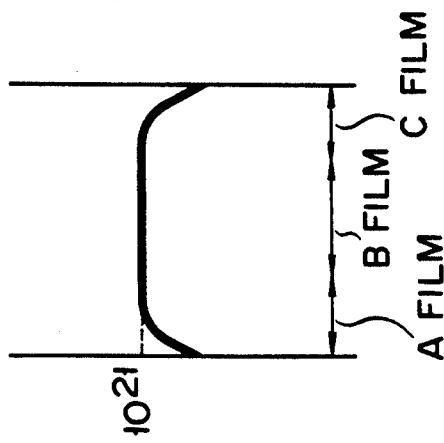
FIG. 6 is a graph showing the phosphorus concentration profile of the first poly-Si layer of a semiconductor device according to the present invention.
Figure 7:
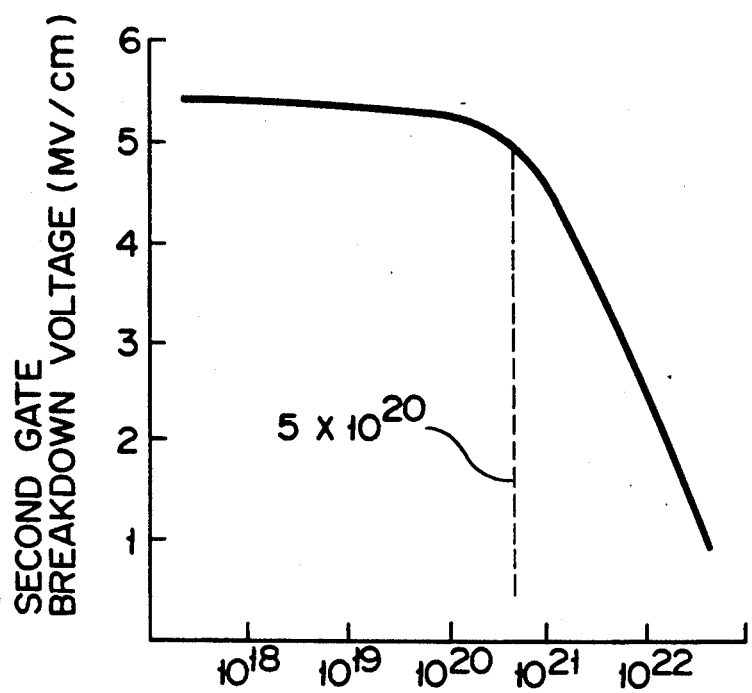
FIG. 7 is a view showing a relation, to a second gate breakdown voltage, of the phosphorus concentration of an A film of a first poly-Si layer in a semiconductor device according to the present invention.
Figure 8:
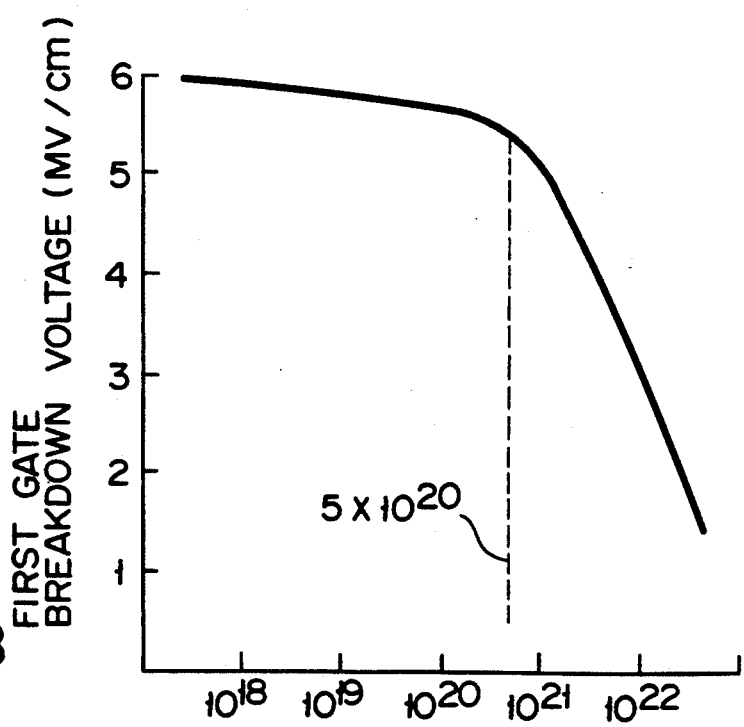
FIG. 8 is a view showing a relation, to a gate breakdown voltage, of the phosphorus concentration of a C film of a first poly-Si layer of the semiconductor device according to the present invention.

According to the present invention, coupled with an improved film density of the first poly-Si layer, as shown in FIG. 6, the C and A films of the first poly-Si layer contain no phosphorus or are made to have a lower phosphorus concentration level than the B film (an intermediate layer). During the heat treatment the phosphorus ions fail to be diffused from the first poly-Si layer to the first and second insulating films so that the breakdown voltage of the first and second insulating films is increased. FIG. 7 graphically shows the relationship between the second gate breakdown voltage of the second insulating film and the phosphorus concentration of the A layer, and FIG. 8 graphically shows the relationship between the first gate breakdown voltage of the first insulating film and the phosphorus concentration of the C layer. As is evident from the two graphs, a high breakdown voltage of the insulating film is maintained when the phosphorus concentration is less than $5 \times 10^{20}$ cm$^{-3}$.

Furthermore, because the phosphorous are diffused into the first poly-Si film at the time of its formation, no diffusion of the phosphorus ions occurs after the poly-Si film has been formed, thus shortening the manufacturing process involved.

Figure 9:
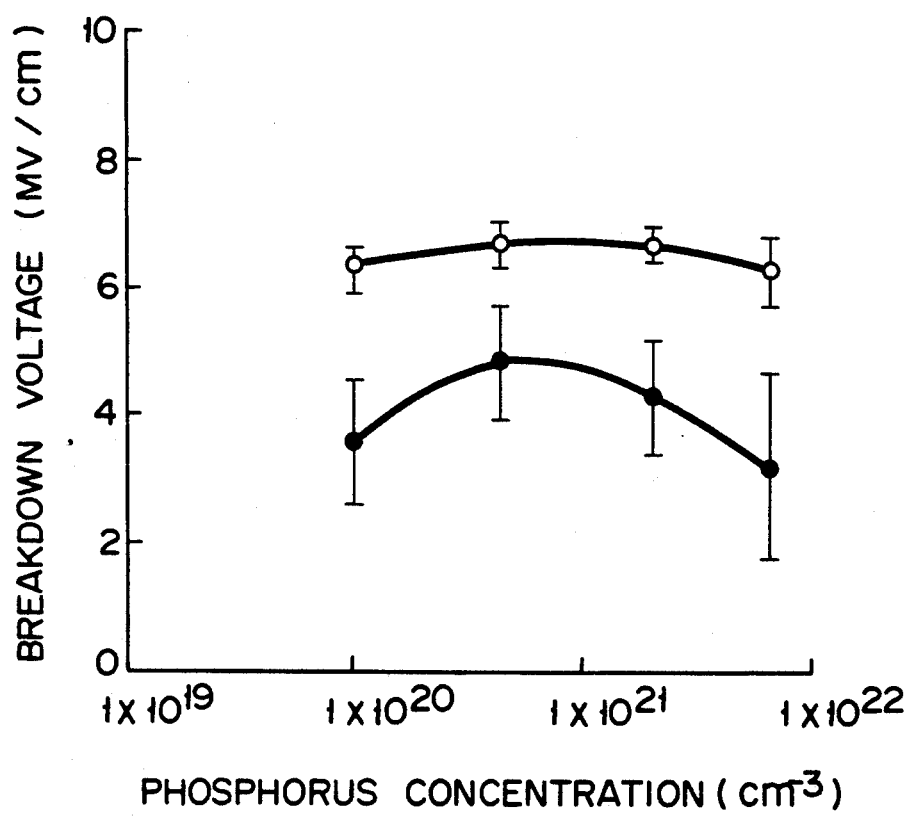
FIG. 9 is a graph showing a relation, to a breakdown voltage, of the phosphorus concentration of the insulating films of the conventional semiconductor device and semiconductor device according to the present invention.

For the sake of comparison, the breakdown voltage of a capacitor manufactured with the method of the present invention and that of a capacitor manufactured with the conventional method were measured, and the results of which are as shown in FIG. 9.

In the graph shown in FIG. 9, the ordinate denotes the breakdown voltage of second insulating film 56 in terms of the field strength upon the application of a voltage across the first and second poly-Si films, and the abscissa denotes the concentration of phosphorus. In FIG. 9, the open circles show values obtained in accordance with the present invention, the solid circles represent values obtained in using the conventional method, and a vertical crossing portion shows variations in the breakdown voltage. It is obvious from FIG. 9 that the improvement in the breakdown voltage is due to the manufacturing process of the present invention.

Although poly-Si film 55 was thermally oxidized in the second deposition process of the embodiment to provide a second film (silicon oxide film 56), the same effect of the present invention can be obtained by using one of the other two insulating films to form a second film.

Although the present invention has been explained in conjunction with an EPROM capacitor, it can also be applied to the other method for the manufacture of a semiconductor device, wherein an electrode having a poly-Si as a major component or an electrode interconnection layer is opposed to the other semiconductor layer via an insulating film.

What is claimed is:
1. A semiconductor device comprising:
a semiconductor substrate of a first conductivity type;
a first insulating film disposed on a major surface of the semiconductor substrate;
a poly-Si film overlying the first insulating film, which film comprises:
a non-single crystal type silicon region on said first insulating film, said non-single crystal type silicon region containing an impurity of a second conductivity type having a predetermined concentration level of less than $5 \times 10^{20}$ cm$^{-3}$;
a first poly-Si region on said non-single crystal type silicon region, said first poly-Si region containing an impurity of the second conductivity type having a first concentration level, said predetermined concentration level of said non-single crystal type silicon region being sufficiently less than said first concentration level to inhibit the diffusion of said first poly-Si regions's impurity into said first insulating film; and a second poly-Si region on said first poly-Si region, said second poly-Si region containing an impurity of the second conductivity type having a second concentration level; and a second insulating film on said second poly-Si region at the poly-Si film, said second concentration level of said poly-Si region being sufficiently less than said first concentration level of said first poly-Si region to inhibit the diffusion of said first poly-Si region's impurity into the second insulating film.

2. A semiconductor device comprising:

a semiconductor substrate of a first conductivity type;

a first insulating film disposed on a major surface of the semiconductor substrate;

a poly-Si film overlying the first insulating film, which film comprises:

a non-single crystal type silicon region on said first insulating film, said non-single crystal type silicon region containing an impurity of a second conductivity type having a predetermined concentration level;

a first poly-Si region on said non-single crystal type silicon region, said first poly-Si region containing an impurity of the second conductivity type having a first concentration level, said predetermined concentration level of said non-single crystal type silicon region being sufficiently less than said first concentration level to inhibit the diffusion of said first poly-Si region's impurity into said first insulating film; and a second poly-Si region on said first poly-Si region, said second poly-Si region containing an impurity of the second conductivity type having a second concentration level of less than $5 \times 10^{20}$ cm$^{-3}$; and a second insulating film on said second poly-Si region of the poly-Si film, said second concentration level of said poly-Si region being sufficiently less than said first concentration level of said first poly-Si region to inhibit the diffusion of said first poly-Si region's impurity into the second insulating film.

3. A semiconductor device comprising:

a semiconductor substrate of a first conductivity type;

a first insulating film disposed on a major surface of the semiconductor substrate;

a poly-Si film overlying the first insulating film, which film comprises:

a non-single crystal type silicon region on said first insulating film, said non-single crystal type silicon region containing an impurity of a second conductivity type having a predetermined concentration level of less than $5 \times 10^{20}$ cm$^{-3}$;

a first poly-Si region on said non-single crystal type silicon region, said first poly-Si region containing an impurity of the second conductivity type having a first concentration level of greater than $5 \times 10^{20}$ cm$^{-3}$, said predetermined concentration level of said non-single crystal type silicon region being sufficiently less than said first concentration level to inhibit the diffusion of said first poly-Si region's impurity into said first insulating film; and a second poly-Si region on said first poly-Si region, said second poly-Si region containing an impurity of the second conductivity type having a second concentration level of; and a second insulating film on said second poly-Si region of the poly-Si film, said second concentration level of said poly-Si region being sufficiently less than said first concentration level of said first poly-Si region to inhibit the diffusion of said first poly-Si region's impurity into the second insulating film.

* * * * *